United States Patent [19]
Madaffari et al.

[11] Patent Number: 5,589,799
[45] Date of Patent: Dec. 31, 1996

[54] LOW NOISE AMPLIFIER FOR MICROPHONE

[75] Inventors: Peter L. Madaffari, Camden; James S. Collins, Lincolnville, both of Me.

[73] Assignee: Tibbetts Industries, Inc., Camden, Me.

[21] Appl. No.: 447,349

[22] Filed: May 23, 1995

Related U.S. Application Data

[63] Continuation of Ser. No. 314,694, Sep. 29, 1994, abandoned.

[51] Int. Cl.$^6$ ..................................................... H03F 3/16
[52] U.S. Cl. ........................... 330/277; 330/310; 381/120
[58] Field of Search .................................. 330/277, 300, 330/310, 311; 381/120, 122

[56] References Cited

U.S. PATENT DOCUMENTS

| | | | |
|---|---|---|---|
| 3,512,100 | 5/1970 | Killion et al. | 330/38 |
| 3,801,933 | 4/1974 | Teare | 330/35 |
| 3,927,383 | 12/1975 | Fjarlie et al. | 330/59 |
| 3,993,869 | 11/1976 | Kono | 179/1 A |
| 4,151,480 | 4/1979 | Carlson et al. | 330/277 |
| 5,017,887 | 5/1991 | Gamand | 330/277 |
| 5,027,080 | 6/1991 | Shiga | 330/277 X |
| 5,083,095 | 1/1992 | Madaffari | 330/277 |
| 5,097,224 | 3/1992 | Madaffari et al. | 330/277 |
| 5,214,709 | 5/1993 | Ribic | 381/68.1 |
| 5,337,011 | 8/1994 | French et al. | 330/258 |

OTHER PUBLICATIONS

Instruments and Experimental Techniques, vol. 16, No. 3, May–Jun. 1973, pp. 837–838, article "A Thermally Durable Preamplifier" by I. N. Poznyak et al.

Edwin S. Oxner, *FET Technology and Application, An Introduction*, pp. 98, 99, published by Marcel Dekker, Inc., New York, 1989.

*Primary Examiner*—Steven Mottola
*Attorney, Agent, or Firm*—Lahive & Cockfield

[57] ABSTRACT

A preamplifier for use with high impedance audio frequency transducers, having two capacitance coupled stages each including a field effect transistor connected in follower mode. The two stages provide an impedance converter. The first field effect transistor is of substantially smaller geometry than the second, providing a low noise, low input capacitance. The second stage further reduces output impedance while maintaining low power supply feedthrough. A capacitor connected in shunt between the stages is employed for frequency shaping.

12 Claims, 2 Drawing Sheets

LOW NOISE AMPLIFIER FOR MICROPHONE

BRIEF SUMMARY OF THE INVENTION

This application is a continuation of Ser. No. 08/314,694, filed Sep. 29, 1994, and now abandoned.

This invention relates generally to audio frequency amplification circuits used as the preamplifier stages of microphone transducers. More particularly, the invention relates to circuits employing field effect transistors operating with low voltage sources, suitable for use with electret based condenser microphones.

The signal-to-noise ratio for electret based condenser microphones has not significantly improved in the past 25 years. During that time there has been a decrease in transducer size, with the signal-to-noise ratio either remaining the same or, in the case of the later smaller transducers, actually declining along with the signal.

In general, transducers having high source impedance require low noise, high input impedance amplifiers. Frequently such transducers, including for example electret based condenser microphones, have such a high source impedance that the coupling of external, unwanted signals will occur through the electrical leads. It is therefore necessary to use a preamplifier to lower the impedance level by many orders of magnitude and to situate the preamplifier as close to the transducer as possible, and preferably internally of its structure. In addition, the high impedance of such transducers requires that the preamplifier have an ultra-high input impedance to prevent signal reduction at the input.

Field effect transistors have been recognized as the most successful devices for such pre-amplification. When low noise is a requirement, the N channel junction field effect transistor (herein called "JFET") is preferred because it utilizes a semiconductor junction rather than a metal oxide capacitor to form the gate structure. This form reduces flicker noise, and can be constructed to have small leakage currents and therefore low shot noise.

U.S. Pat. No. 5,097,224, issued on Mar. 17, 1992 to the present applicant and Michael J. Wurtz, discloses a preamplifier circuit with a field effect transistor configured in the follower mode. In this circuit a source resistor comprises the load impedance.

U.S. Pat. No. 4,151,480 issued on Apr. 24, 1979 to Carlson et al discloses an amplification circuit employing, in addition to a field effect transistor connected in follower mode, a second field effect transistor used as a current source in lieu of a source resistor, thus providing a much higher ac load impedance than would a simple resistor with the same dc current flowing through it.

U.S. Pat. No. 3,512,100 issued May 12, 1970 to Burkhard et al discloses a pair of diodes of opposite polarity connected in parallel as the gate bias of a field effect transistor connected in follower mode. Whereas a resistor of large impedance used for gate bias can introduce noise at low frequencies (up to about 1000 Hz), the use of diodes dramatically reduces noise at those frequencies because the diodes act as resistors of very much larger values. However, such diodes can be prone to failure due to electrostatic discharge.

U.S. Pat. No. 5,083,095 issued Jan. 21, 1992 to the present applicant discloses a preamplifier that reduces the effective gate to drain interelectrode capacitance by the use of active feedback in a cascode arrangement of two JFETs. This application reduces signal loading and attenuation at the input, but the use of the second transistor in the cascode arrangement decreases the available operating voltage for the first JFET, used at the input. This is in addition to the substantial voltage drop in the source resistor.

With the object of making substantial improvements in the signal-to-noise ratio, especially for electret based condenser microphones, the present invention recognizes two causes that are basically responsible for the previous lack of progress. The first is a misconception of the noise sources in a modem transducer. In particular, there is a common misconception that the channel impedance of the JFET is the primary noise source. The second misconception is a failure to match transistor design to transducer design.

The present invention provides a low noise, low input capacitance impedance converter using field effect transistors for the active devices, capable of operation from low power supply voltages as small as a single cell. The circuit is suited as the preamplifier for transducers, especially electret based condenser microphones used in hearing aids.

The preferred embodiments of the invention include two N channel junction JFET follower stages connected by two capacitors, one used for coupling between the stages and one for frequency shaping. The first stage affords low input capacitance, improved power supply feedthrough reduction, frequency shaping of the input signal and moderate impedance conversion. The second stage, which buffers between the first stage and the load, further reduces output impedance while maintaining low power supply feedthrough.

Power gain is achieved through the current amplification of the two stages with the beneficial aspects of the first stage achieved by a reduction in the geometry of the active device, and the beneficial aspects of the second stage achieved by a magnification of the geometry. In operation with a suitably designed electret microphone "motor" assembly, this circuit provides electrical attenuation of the electro-acoustic transducer resonance, reducing the requirement for acoustic damping, a factor which, along with the ultra high impedance gate bias circuit, provides a significant improvement in the overall signal-to-noise ratio.

The preamplifier of this invention reduces the noise level and therefore improves the signal-to-noise ratio of conventionally sized transducer devices. Furthermore, when this preamplifier is used with extremely small transducers, the smaller geometry of the first stage causes a lessened attenuation of the input signal and decreased power supply feedthrough due to capacitive coupling at the gate to the high side of the power supply. A feature of this invention, as stated above, resides in the reduced size of the input JFET as compared with the geometry hitherto employed in the above described prior art circuits, thereby reducing the capacitances between the gate and drain and between the gate and source, respectively. On the other hand, the size of the second stage JFET is substantially greater than the size hitherto normally employed in such prior art circuits.

Because of the use of a JFET as the input device for the second stage, its high input impedance allows the use of a small capacitor for coupling, thus facilitating integration of such capacitor onto a die with the active elements, diodes and resistors.

A further feature is the use of a resistor in series with parallel connected opposed diodes to form the gate bias for each of the first and second stage JFETs. This resistor acts to limit current if the amplifier is accidentally reverse biased. In the first stage, the effect of the diodes and protective resistor is to bias the gate above ground. This allows a third JFET employed as a current source to be better controlled by means of its own load resistor, with its gate connected directly to ground rather than through a resistor. This produces a "stiffer" current source.

DRAWING

DETAILED DESCRIPTION

Figure 1:
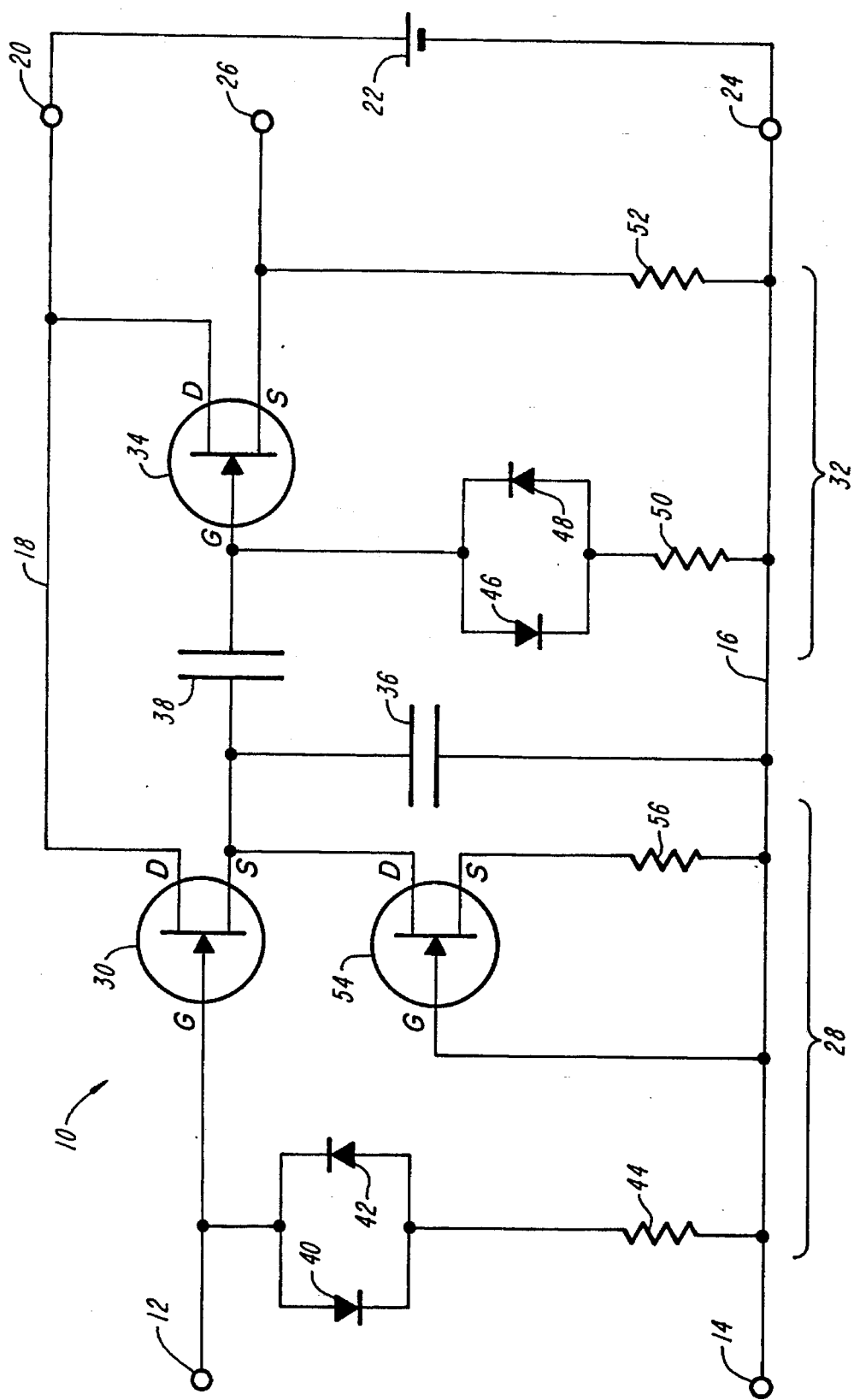
FIG. 1 illustrates a presently preferred embodiment of the invention.

Referring to the drawing, the presently preferred embodiment of this invention is a preamplifier designated generally at 10, which is provided with input terminals 12 and 14 for connection to an electroacoustic transducer, for example an electret based condenser microphone used in hearing aids. Typically, such transducers are characterized by a high output impedance and generally by some acoustic source noise, for example noise caused by acoustic resistive losses. One of these terminals is connected to the ground rail 16 of the circuit. An upper power supply rail 18 is connected to a terminal 20, and a dc source 22 which may be as low as 0.9 volt, for example, is connected between the terminal 20 and a terminal 24 which is connected to the rail 16. The output signal appears between the terminal 24 and a terminal 26.

The circuit generally comprises a first stage 28 having a first JFET 30 connected in follower mode, and a second stage 32 having a second JFET 34 also connected in follower mode. The stages are interconnected by a shunt capacitor 36 and a coupling capacitor 38 the functions of which are respectively described below.

The source, gate and drain terminals of the respective field effect transistors are correspondingly labeled "S," "G" and "D," respectively.

The gate bias impedance circuit for the JFET 30 comprise a pair of parallel connected diodes 40 and 42 of opposite polarity and a resistor 44 connected in series therewith. The diodes act as resistors whose value is hundreds of gigaohms. Similarly, the gate bias impedance circuit for the JFET 34 comprises a pair of parallel connected diodes 46 and 48 of opposite polarity and a resistor 50 in series therewith.

The load impedance of the circuit connected between the source of the JFET 34 and the ground rail 16 comprises a resistor 52. Although in some embodiments a resistor may be similarly connected between the source of the JFET 30 and ground, it is preferred to provide a third JFET 54 having its gate connected to ground and having its source connected through a resistor 56 to ground. Alternatively, its source may be connected directly to ground. As so connected the JFET 54 acts as a current source.

A characteristic of the present invention is that the first stage or input JFET 30 is very much smaller in size than the output or second stage JFET 34. As a measure of this size difference, it is convenient to use, as the standard for comparison, the size of a conventional transistor such as the 2N4338 manufactured by Siliconix, National Semiconductor, and others. In a typical circuit according to this invention, the JFET 30 is less than half and preferably less than one-third the size of the conventional 2N4338, and the JFET 34 is on the order of two or more times the size of the conventional 2N4338 transistor. Thus the ratio of sizes of the two JFETS is preferably six to one, and may be much greater in some cases.

The size of the JFET 54 is typically smaller than that of the JFET 30. Preferably, the pinch off voltage for the JFET 54 is equal to or lower than that for the JFET 30. In operation, the JFET 54 operates as the load by acting substantially as a current source, and limits the current to approximately one microampere. Because of the small size of the JFET 30 and the low current of the JFET 54, the output impedance of the first stage 28 is much higher than that found in conventional JFET circuits connected in follower mode, and the transconductance of the JFET 30 is lower.

The capacitor 36, in shunt with the output impedance of the first stage, acts to roll off the higher frequencies. The capacitor 38 couples the signal to the gate of the JFET 34, and may be on the order of 50 pfd, but notwithstanding its small size it does not attenuate the low audio frequencies because the JFET 34 has a very high input impedance.

The JFET 34 is larger than a normal transistor used in such circuits, so that the output impedance is low without excessive current draw.

The size of the diodes employed in the circuit is conveniently compared with that of a conventional 1N4148 small signal diode manufactured by National Semiconductor, taken as a standard for reference. The diodes 40 and 42 are much smaller than the reference diode, for example one-tenth the size thereof, so as to minimize shunt capacitance and maximize shunt resistance.

The value of the shunt capacitor 36 is chosen such that the combination of the first stage output impedance and the capacitor 36 forms an RC roll off at frequencies above a characteristic frequency $f_o$. The latter frequency is chosen to coincide approximately with the incipient peaking of the acoustic circuit, resulting in a substantially flat overall response within the desired frequency pass band and an attenuation of the peak. Above the pass band, it results in an additional 6 dB per octave roll off beyond that which normally occurs from acoustic elements. The overall result is therefore a decrease in the total acoustic noise contribution of the source transducer.

The use of an RC roll off has the further advantage that it can attenuate ultrasonic acoustic pickup and reduce the tendency for overload.

Alternative embodiments of the circuit herein described may be constructed, in which the condenser 36 is replaced by an impedance network specifically designed to produce band acceptance, band rejection, high pass or low pass filtering, as dictated by the particular frequency shaping requirements of the application. For example, such networks may include inductive and resistive impedances or inductive, resistive and capacitive impedances.

From the foregoing description it will be recognized that because of the small size of the JFET 30 there is a substantial reduction in the input capacitance, whereby there is a corresponding reduction in the input signal attenuation and power supply feedthrough. Also, by employing the JFET 54 as a current source the current consumption of the JFET 30 is limited and the follower gain is increased to more closely approximate unity.

Figure 2:
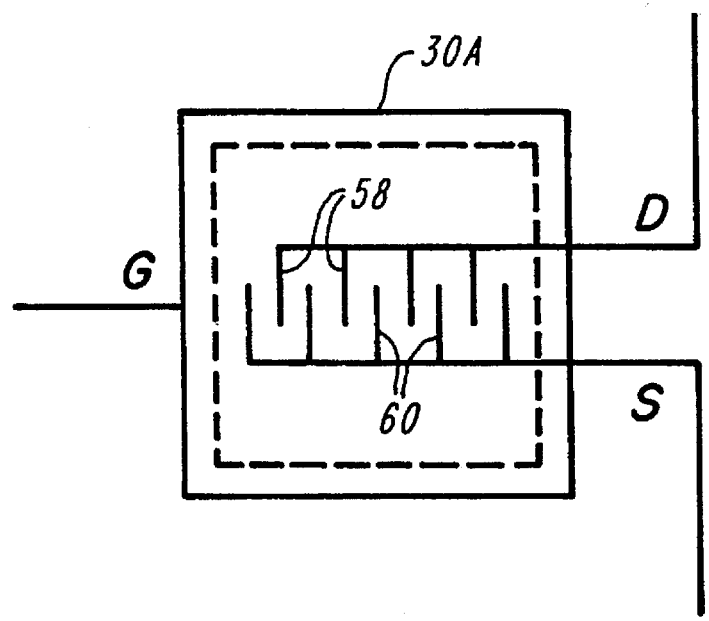
FIG. 2 illustrates an alternative form of JFET transistor having an asymmetric source and drain configuration.

A further improvement may be made in the above-described circuit by employing a JFET 30 of asymmetric source and drain configuration, shown in FIG. 2 as a JFET 30A. In this JFET the drain has fewer "fingers" 58 than the "fingers" 60 of the source, with the result that when compared to a symmetric geometry the device will have a lower gate-to-drain capacitance and hence a lower power supply feedthrough.

We claim:

1. A preamplifier for a high impedance microphone comprising, in combination, first and second stages each comprising a JFET connected in follower mode, each stage having a gate to ground input impedance, an output impedance connected from its source to ground independently of said input impedance and a drain connected to a power supply terminal, the source of the first stage JFET having a circuit connection to the gate of the second stage JFET, the size of the first stage JFET being less than half, and the size of the second stage JFET being more than twice, the size of a 2N4338 transistor considered as a standard for reference purposes.

2. A preamplifier according to claim 1, in which the source of the first stage JFET is connected to the gate of the second stage JFET through a coupling capacitor.

3. A preamplifier according to claim 1, in which the input impedance of at least one stage includes a pair of diodes of opposite polarity connected in parallel.

4. A preamplifier according to claim 3, in which the parallel connected diodes are connected in series with a resistor.

5. A preamplifier according to claim 4, in which the input impedance of each stage includes a pair of diodes of opposite polarity connected in parallel, said parallel connected diodes being connected in series with a resistor.

6. A preamplifier for a high impedance microphone comprising, in combination, first and second stages each comprising a JFET connected in follower mode and having a gate to ground input impedance, a source to ground output impedance and a drain connected to a power supply terminal, the source of the first stage JFET having a circuit connection to the gate of the second stage JFET, and a capacitor connected between the source of the first stage JFET and ground and adapted in combination with the output impedance of the first stage to shape the frequency response characteristic thereof, the size of the first stage JFET being less than half, and the size of the second stage JFET being more than twice, the size of a 2N4338 transistor considered as a standard for reference purposes.

7. A preamplifier for a high impedance microphone comprising, in combination, first and second stages each comprising a JFET connected in follower mode and having a gate to ground input impedance, a source to ground output impedance and a drain connected to a power supply terminal, the source of the first stage JFET having a circuit connection to the gate of the second stage JFET, the size of the first stage JFET being less than half, and the size of the second stage JFET being more than twice, the size of a 2N4338 transistor considered as a standard for reference purposes, the output impedance of the first stage comprising a third JFET of smaller size than the first stage JFET and having its drain connected to the source thereof, its source having a circuit to ground and its gate being connected directly to ground.

8. A preamplifier for a high impedance microphone comprising, in combination, first and second stages each comprising a JFET connected in follower mode and having a gate to ground input impedance including a pair of diodes of opposite polarity connected in parallel, a source to ground output impedance and a drain connected to a power supply terminal, the source of the first stage JFET having a circuit connection to the gate of the second stage JFET including a series coupling capacitor, the operating transconductance of the first stage JFET being substantially less than that of the second stage JFET, the output impedance of the first stage comprising a third JFET operating substantially as a current source.

9. A preamplifier according to claim 8, in which the gate to ground input impedance of each stage comprises a protective resistor in series with said parallel connected diodes, and including a capacitor connected between the source of the first stage JFET and ground and adapted to roll off the high frequency response of the preamplifier.

10. A preamplifier according to claim 8, including a filter connected between said circuit connection and ground and adapted to shape the frequency response of the preamplifier.

11. A preamplifier for a high impedance microphone comprising, in combination, first and second stages each comprising a JFET connected in follower mode, each stage having a gate to ground input impedance, an output impedance connected from its source to ground independently of said input impedance and a drain connected to a power supply terminal, the source of the first stage JFET having a circuit connection to the gate of the second stage JFET, the size of the first stage JFET being less than half, and the size of the second stage JFET being more than twice, the size of a 2N4338 transistor considered as a standard for reference purposes, and a shaping impedance connected between the source of the first stage JFET and ground and adapted in combination with the output impedance of the first stage to shape the frequency response characteristic thereof.

12. A preamplifier for a high impedance microphone comprising, in combination, first and second stages each comprising a JFET connected in follower mode, each stage having a gate to ground input impedance, an output impedance connected from its source to ground independently of said input impedance and a drain connected to a power supply terminal, the source of the first stage JFET having a circuit connection to the gate of the second stage JFET, the size of the first stage JFET being less than half, and the size of the second stage JFET being more than twice, the size of a 2N4338 transistor considered as a standard for reference purposes, the first stage JFET having an asymmetric source and drain configuration, with the drain having fewer "fingers" than the source, whereby when compared to a symmetric geometry said JFET has a lower gate to drain capacitance and hence a lower power supply feedthrough.

* * * * *

UNITED STATES PATENT AND TRADEMARK OFFICE
CERTIFICATE OF CORRECTION

PATENT NO.    :   5,589,799
DATED         :   December 31, 1996
INVENTOR(S)   :   Peter L. Madaffari and James S. Collins It is certified that error appears in the above-indentified patent and that said Letters Patent is hereby corrected as shown below:

Column 2, line 11, cancel "modem" and substitute --modern--

Column 5, (claim 5), line 26, cancel "4" and substitute --7--

Signed and Sealed this

Fifteenth Day of April, 1997

Attest:

BRUCE LEHMAN

*Attesting Officer*    *Commissioner of Patents and Trademarks*